United States Patent
Daoudi et al.

(10) Patent No.: US 7,764,079 B1
(45) Date of Patent: Jul. 27, 2010

(54) MODULAR PROBE SYSTEM

(75) Inventors: Mostafa Daoudi, Essex, VT (US); Don Feuerstein, Southbury, CT (US); Denis Place, Colchester, VT (US)

(73) Assignee: SemiProbe LLC, Burlington, VT (US)

( * ) Notice: Subject to any disclaimer, the term of this patent is extended or adjusted under 35 U.S.C. 154(b) by 286 days.

(21) Appl. No.: 12/023,787

(22) Filed: Jan. 31, 2008

Related U.S. Application Data (60) Provisional application No. 60/887,426, filed on Jan. 31, 2007.

(51) Int. Cl.
*G01R 31/26* (2006.01)
(52) U.S. Cl. ...................... 324/765; 324/754
(58) Field of Classification Search ......... 324/754–765, 324/158.1; 439/66, 482
See application file for complete search history.

(56) References Cited

U.S. PATENT DOCUMENTS

| | | | |
|---|---|---|---|
| 3,175,820 A | 3/1965 | Schiler | |
| 4,073,215 A | 2/1978 | Coope et al. | |
| 4,157,819 A | 6/1979 | Meyer | |
| 4,258,928 A | 3/1981 | Wiesler | |
| 4,502,457 A | 3/1985 | Marron | |
| 4,630,811 A | 12/1986 | Rudisill | |
| 4,640,501 A | 2/1987 | Poland | |
| 4,641,819 A | 2/1987 | Poland | |
| 4,684,113 A | 8/1987 | Douglas et al. | |
| 5,026,033 A | 6/1991 | Roxy | |
| 5,107,599 A | 4/1992 | Marincic et al. | |
| 5,305,992 A | 4/1994 | Kish | |
| 5,362,036 A | 11/1994 | Whiteman | |
| 5,438,740 A | 8/1995 | Carr et al. | |
| 5,462,263 A | 10/1995 | Feltrin | |
| 5,887,733 A | 3/1999 | Harvey et al. | |
| 5,936,153 A | 8/1999 | Steckler et al. | |
| 6,113,088 A | 9/2000 | Gakhar et al. | |
| 6,279,888 B1 | 8/2001 | Wal, III | |
| 6,298,572 B1 | 10/2001 | McAuley | |
| 6,331,770 B1 * | 12/2001 | Sugamori | 324/158.1 |
| 6,449,741 B1 | 9/2002 | Organ et al. | |
| 6,621,282 B2 | 9/2003 | Hollman | |
| 6,624,646 B2 * | 9/2003 | Zaiser | 324/754 |
| 6,857,628 B2 | 2/2005 | Baker | |
| 6,961,672 B2 | 11/2005 | Kasapi | |
| 7,036,810 B2 | 5/2006 | Wal, III | |
| 7,164,278 B2 * | 1/2007 | Hirschmann | 324/754 |
| 7,319,336 B2 | 1/2008 | Baur et al. | |
| 7,339,385 B2 * | 3/2008 | Takasu et al. | 324/754 |
| 7,471,100 B2 * | 12/2008 | Miller et al. | 324/763 |
| 2006/0284528 A1 | 12/2006 | Saunders | |

* cited by examiner

*Primary Examiner*—Ha Tran T Nguyen
*Assistant Examiner*—Arleen M Vazquez
(74) *Attorney, Agent, or Firm*—Downs Rachlin Martin PLLC (57) ABSTRACT

A modular probe system that includes components that are selected to test different devices-under-test (DUTs) in a number of different scientific fields. The system includes quick-release connectors that may be used to releasably secure components of the modular probe system to one another or to a mounting interface. These connectors permit quick and easy attachment and detachment of various components in a manner that permits a user to readily configure the probe system for each DUT.

5 Claims, 6 Drawing Sheets

MODULAR PROBE SYSTEM

RELATED APPLICATION DATA

This application claims the benefit of priority of U.S. Provisional Patent Application Ser. No. 60/887,426, filed Jan. 31, 2007, and titled Modular Probe System and Method, which is incorporated by reference herein in its entirety.

FIELD OF THE INVENTION

The present invention generally relates to the field of test devices. In particular, the present invention is directed to a modular probe system.

BACKGROUND

Probe systems are used to analyze, examine, and test devices in many industries, such as the semiconductor and material science industries. Probe systems are capital equipment that may range in price from $15,000 to over $1,000,000. Purchasing capital equipment is believed to be the second largest expense associated with operating a semiconductor facility. Conventional probe systems typically offer no flexibility or upgradeability in terms of size, materials that can be probed and other capabilities. For example, if a user desires to probe a larger semiconductor wafer than the one for which their existing system is designed, that user would likely need to replace the existing system with a new probe system or a substantially refurbished system. In addition, if a user wants to probe materials in two different scientific fields, e.g., semiconductor and life sciences, two different probe systems are generally required. Particularly for smaller businesses, academic institutions and other organizations with limited capital equipment budgets, the cost of two probe systems can be prohibitively expensive. Moreover, new probe systems are often not immediately available, with delivery times of 8-12 weeks being typical. To complicate matters, strong disincentives are believed to exist in the probing industry to deviate from the use of probe systems that are dedicated to a given test, and are not easy to upgrade or otherwise change.

Modular fixturing systems are known in the prior art. These systems often include a base plate having a plurality of apertures for receiving various supports for holding a work piece during a manufacturing operation. The location of the supports is chosen as a function of the configuration of the work piece to be supported. Such known fixturing systems are not believed to include all of the components necessary to perform the manufacturing operation; rather, the fixturing systems are merely used with such components. In any event, such known fixturing systems are not used in connection with precision testing of a device-under-test ("DUT") through the use of delicate probes, as discussed above.

SUMMARY OF THE DISCLOSURE

One implementation of the present invention is a modular test system for testing a device-under-test (DUT). The system includes a mounting interface; a plurality of components removably positionable, directly or indirectly, on the mounting interface, the plurality of components including at least one probe, wherein the plurality of components together are used in connection with testing a DUT; and a plurality of quick-release connectors for releasably securing the plurality of components together or to the mounting interface by hand or with only hand tools in under 60 minutes.

Another implementation of the present invention is a probe system for testing a device-under-test (DUT). The probe system includes a base having a mounting interface; a first stage releasably secured to the mounting interface so as to be replaceable with a second stage in less than 60 minutes with only hand tools or by hand; a first chuck releasably secured to one of the first and second stages so as to be replaceable with a second chuck in less than 60 minutes with only hand tools or by hand, wherein the first and second chucks are capable of supporting the DUT; a first manipulator releasably secured proximate one of the first and second chucks so as to be replaceable with a second manipulator in less than 60 minutes with only hand tools or by hand; and a first probe releasably secured to one of the first and second manipulators so as to receive test information from the DUT and so as to be replaceable with a second probe in less than 60 minutes with only hand tools or by hand.

Still another implementation of the present invention is a method of testing a device-under-test (DUT). The method includes a) providing a testing system having a mounting interface; b) releasably securing a first plurality of components used in testing a DUT to the mounting interface; and c) removing at least some of the first plurality of components from the mounting interface and releasably securing a second plurality of components used in testing a DUT to the mounting interface, wherein the first plurality of components are removed and the second plurality of components are releasably secured by hand or using only hand tools in less than about 60 minutes.

BRIEF DESCRIPTION OF THE DRAWINGS

For the purpose of illustrating the invention, the drawings show aspects of one or more embodiments of the invention. However, it should be understood that the present invention is not limited to the precise arrangements and instrumentalities shown in the drawings, wherein.

DETAILED DESCRIPTION

Figure 1:
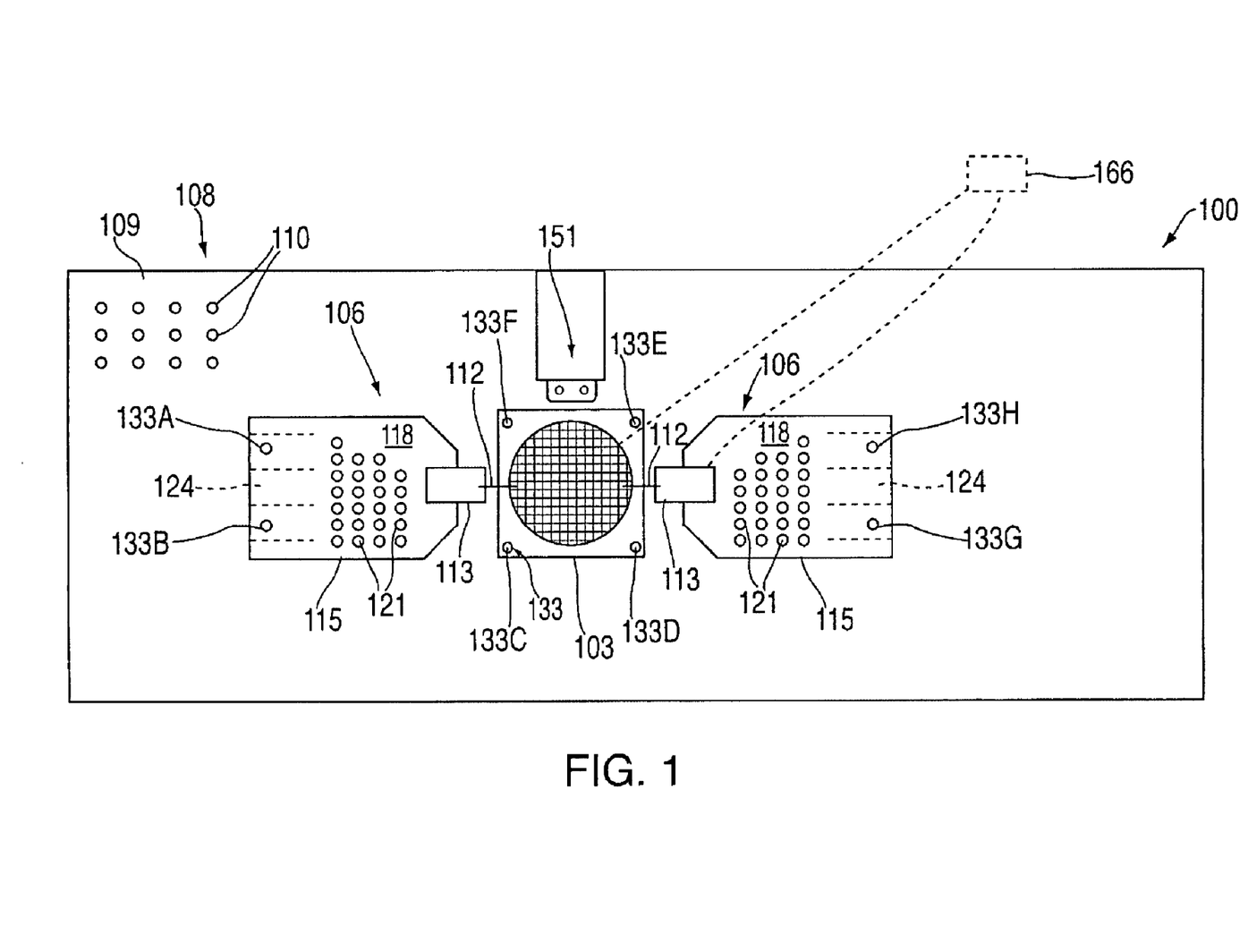
FIG. 1 is a schematic top view of a modular probe system.
Figure 2:
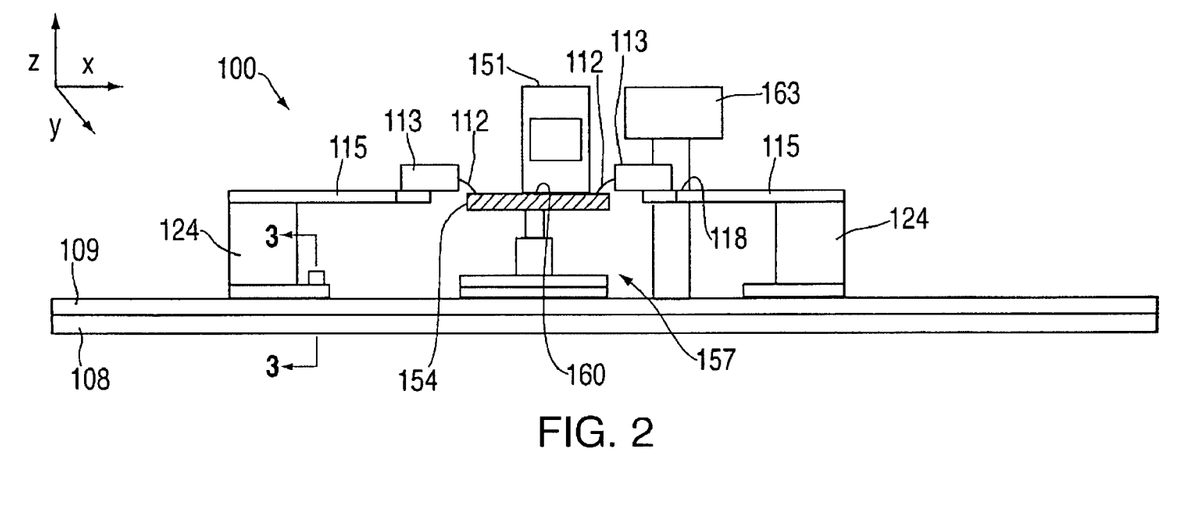
FIG. 2 is a schematic side view of the modular probe system illustrated in FIG. 1.

Referring now to the drawings, FIGS. 1 and 2 illustrate an example of a modular probe system 100 made in accordance with concepts of the present invention. System 100 is configured to test a device-under-test (DUT) 103, e.g., diced or undiced semiconductor chips in a semiconductor wafer, packaged parts, substrates, printed circuit boards, microscope slides, and optics and optical components, among others. System 100 is denoted as being "modular" because it is made up of several components 106 releasably secured to a base 108. Some or all of components 106 may be quickly and easily replaced with other components or freely moved around to other locations. As a result, modular probe system 100 provides a single platform that can be used to perform different analysis and/or apply different testing protocols on DUTs from substantially different scientific fields. For example, system 100 can be first configured to probe a semiconductor wafer and provide data regarding its performance, and then can be easily reconfigured to probe a microscope slide and provide micro-fluidic sampling data used in biological analysis.

As discussed above in the Background section, a limitation of traditional probing systems is that their existing structure and/or components cannot be changed, i.e., they are dedicated systems designed to perform just one probing operation on one type of DUT. As alluded to above, these probing systems typically require extensive physical modifications to permit them to perform a different probing operation that is different than the one for which they were designed, or to perform the same probing operation on a DUT other than the DUT the system was originally designed to test. Such changes usually entail moving the entire probing system to a re-manufacturing location remote from the facility where it is used. Probing system 100 illustrated in FIGS. 1 and 2, on the other hand, drastically reduces the cost and time associated with performing such modifications through the use of components 106 that may quickly and easily be removed and replaced, in the field, with other components. That is, components 106 of system 100 may be configured to test one aspect of a DUT 103 and then reconfigured to test another aspect of the DUT. This reconfiguration may be performed by a user, e.g., a lab technician, by hand or through the use of conventional hand tools (e.g., a screw driver, a wrench) in about 15-30 minutes, depending on the type of component 106 being replaced and other criteria, as discussed more below.

As noted above, probe system 100 includes a base 108 that supports components 106. Suitable materials for use in base 108 will be readily apparent to those having ordinary skill in the art, and include, without limitation, steel, aluminum, marble, slate, and bronze. While not depicted specifically in the exemplary probing system of FIG. 1, base 108 may include additional structural portions, e.g., a frame. These structural portions are often designed in accordance with specific standards or, alternatively, are based on the desired application for probing system 100. For example, some structural portions may be selected in accordance with a particular level of vibration isolation. Other structural portions may be selected for applications that use particular materials (e.g., chemicals), lighting (e.g., UV lighting), or that require a particularly high level of electro-static discharge (e.g., rubberized materials).

System 100 may also include a mounting interface 109 that is disposed on base 108, or, in an alternative implementation, is built into base 108. Mounting interface 109 is generally sized to receive a number of components 106 at any given time. Preferably, but not necessarily, mounting interface 109 has a surface area of about 1 ft$^2$ to about 24 ft$^2$, although intended application and other factors will dictate the actual surface area chosen. When disposed on base 108, mounting interface 109 may be made from a variety of materials, such as those materials discussed in connection with base 108 above.

Mounting interface 109 is configured so that components 106 may be releasably secured thereto. To achieve this function, mounting interface 109 includes a plurality of apertures 110, e.g., threaded holes, that are sized and configured to receive quick-release connectors, discussed more below. Apertures 110 may be evenly distributed over mounting interface 109. Alternatively, apertures 110 may be located in groups of various numbers and/or patterns. For convenience of illustration, only a few apertures 110 are illustrated in FIG. 1; in most cases, the entire surface of mounting interface 109, or a significant portion thereof, will include apertures 110. When used with other quick-release connectors, such as the exemplary connectors discussed below, mounting interface 109 may include other types of apertures, surfaces, and/or materials, as desired.

In the example of probing system 100 illustrated in FIGS. 1 and 2, components 106 may include one or more manipulators 113 that receive one or more conventional probes 112. Probes 112 for use in testing a semiconductor chip, for example, are typically electrically conductive pins and/or projections that are designed to stimulate a particular portion of the semiconductor wafer and receive the response. Probes 112 used in other scientific fields may include, but are not limited to, HF/Microwave probes, DC probes, multi-contact wedges, probe cards, micro-fluidic sampling probes, micro-fluidic applicators, refractory probes for optics, as desired. These may be selected based on the application, e.g., the DUT 103 to be tested and/or the corresponding scientific field. Preferably, but not necessarily, probes 112 are releasably connected to manipulators 113 in a manner so as to permit them to quickly and easily added and removed from system 100. This feature improves changeover of system 100 from one type of test to another on a given DUT 103, or from one DUT to another DUT, as desired.

Although they may be included as an optional component 106 in system 100, manipulators 113 are typically of the kind that adjust the location of probes 112 in relation to DUT 103. Manipulators 113, for instance, may be configured to translate probe 112 in precise increments, e.g, micro-meter (μm) or nano-meter (Nm). They may be manual, e.g., mechanical or fluid drive, semiautomatic, e.g., motorized without encoder feedback or fully automatic, e.g., programmable with encoder feedback. Manipulators 112 may also include a manipulator arm (not shown). Typical manipulator arms support probe 112 in a manner that positions the probe in desired testing relationship with DUT 103. Exemplary manipulator arms include, for example, DC arms, HF/Microwave arms, coaxial/triaxial arms, high current/high voltage arms, inker arms, contact sense arms, adjustable arms, picoprobe arms and others.

Components 106 may also include a support platen 115 that receives manipulators 113 and/or probes 112. Generally, support platen 115 is constructed of conductive or non-conductive materials chosen to support manipulators 113, manipulator arms, and probes 112 with the desired precision, stability and other requirements needed for the DUT 103 being tested. For example, support platen 115 may be made of steel or aluminum. In one implementation, platen 115 has a platen surface 118 with a surface area from about 1 ft$^2$ to about 4 ft$^2$. Platen surface 118 includes a plurality of mounting positions 121. Each mounting position 121 is designed to receive a manipulator 113, manipulator arm, and/or probe 112. As discussed in more detail below, some or all of mounting positions 121 can be formed in a manner that enhances the flexibility of set-up for probe system 100.

Components 106 may further include a platen mount 124 that supports platen 118. Like support platen 115 discussed above, each platen mount 124 is preferably constructed of conductive or non-conductive materials suited to support platen 115 (as well as manipulator 113, manipulator arm, and probes 112). Platen mount 124 includes an upper surface to which support platen 115 may be attached, directly or indirectly, and a bottom surface that rests, directly or indirectly, on mounting interface 109 and may be releasably attached thereto, as described more below. Optionally, system 100 may include a translation device (not shown) positioned between support platen 115 and platen mount 124 that permits support platen 115 to be moved in one or more directions, such as an x-direction, a y-direction, a z-direction, and/or a θ-direction relative to stationary platen mount 124. This translation device may provide coarse and fine adjustment of probe 112 relative to DUT 103, and may be manual, e.g., mechanical or fluid drive, semiautomatic, e.g., motorized without encoder feedback or fully-automatic, e.g., programmable with encoder feedback. Once in its preferred location, support platen 115 and/or platen mount 124 may include a locking feature that secures the support platen to the platen mount and prevents any relative motion between the two.

In one implementation, probe system 100 includes quick-release connectors 133, e.g., connectors 133A-H, that releasably secure manipulators 112, platen mount 124 and other components 106 discussed in more detail below to one another and/or to mounting interface 109, as the case may be. In some cases it may be desirable to permanently mount certain components 106 to mounting interface 109 and releasably secure other components to the mounting interface. In other case, it will be desirable to releasably secure all components 106 to mounting interface 109 using quick-release connectors 133.

Quick-release connectors 133 may be designed to permit a user to operate the connectors by hand or by using simple hand tools. The design of connectors 133 may, if desired, be selected to amplify the force applied by a user in a manner that permits a component 106 to be securely attached to and easily removed from probing system 100. Such features also permit components 106 to be moved from one location to another within probing system 100, as desired.

Figure 3:
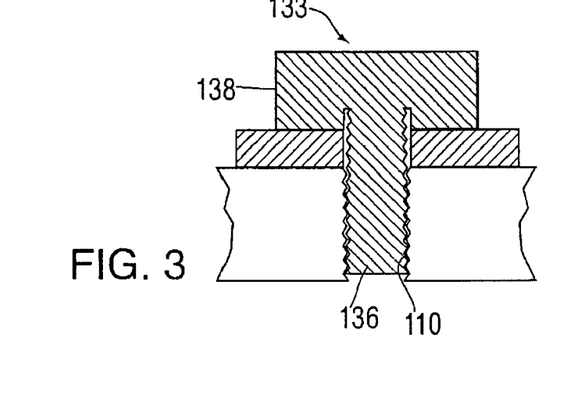
FIG. 3 is across-sectional view of a quick-release connector for use with a modular probe system, such as the modular probe system shown in FIGS. 1 and 2.

FIG. 3 illustrates one example of a quick-release connector 133. Here, the exemplary connector 133 is a threaded connector that includes a threaded shaft 136 and a large head 138 attached to the shaft, with the head being sized configured for comfortable and secure receipt in the hand of a user. When connectors 133 with a threaded shaft 136 will be used in probe system 100, at least some of the apertures 110 in mounting interface 109 have a diameter and thread pitch corresponding with that of threaded shaft 136. This arrangement permits connectors 133 to be releasably threadedly engaged with mounting interface 109. The thread pitch for apertures 110 and threaded shaft 136, and the size and configuration of head 138 may be selected so that a typical user of probe system 100 can grasp the head, by hand, and secure a component 106 to mounting interface 109 by applying a torque of about 1 ft*lbs to about 50 ft*lbs, as desired. In an alternative configuration, a nut (not shown) may be used in lieu of large head 138 to secure connector 133 in aperture 110. With this alternative configuration, a user may tighten connector 133 using conventional hand tools such as a ratchet or wrench by applying a torque of about 1 ft*lbs to about 50 ft*lbs, as desired. In one implementation, connectors 133 may be tightened or loosened with application of about 20 ft*lbs of torque.

Quick-release connectors 133 may have other designs, including, but are not limited to, bolt-down connectors, magnetic interconnections, vacuum-based interconnections, securable pegs, and other implementations capable of securing components 106 to each other and/or to mounting interface 109, as the case may be. A more detailed discussion of the use of quick-release connectors 133 will be provided along with a discussion of a preferred method of changing probing system 100 from one configuration to another in connection with FIG. 4, below. Before proceeding with that description, however, other components 106 of probing system 100 will be described in more detail first.

Components 106 may further include a vision system 151 that can be used to view and/or examine DUT 103. A variety of suitable devices for use as vision systems 151 are known in the art. Exemplary devices include, but are not limited to, an infrared (IR) microscope, a compound microscope, a stereo-zoom microscope, a camera, a polarizer/analyzer, a closed-circuit television (CCTV) camera, a CCD-based or other pattern recognition system, and other devices that provide images of DUT 103. It may be desirable, for instance, to include in system 100 a microscope that can be used to visually verify the position of probes 112 as they relate to the tested portion of DUT 103, and to view the DUT.

As with the other components of system 100 discussed above, vision system 151 may be releaseably secured to mounting interface 109, e.g., using one or more quick-release connectors 133. This arrangement permits a user to quickly change from a first vision system 151 to a second vision system, or permits the vision system to be moved from a first position to a second position. To facilitate mounting and operation of the vision system 151, the latter may include, for example, stand alone booms, posts or bridges, a bread board boom, vision movement stages with or without vision lift, and other devices.

Components 106 include a chuck 154 and a stage 157 that supports and, optionally, can be used to position the chuck. Chuck 154 is shaped and configured based on the size and configuration of DUT 103. For example, when DUT 103 is a semiconductor wafer as illustrated in FIGS. 1 and 2, chuck 154 includes a support surface 160 that supports the semiconductor wafer. Support surface 160 is generally a flat surface formed of a suitable structural material, e.g., aluminum, steel, plastic. In some examples, support surface 160 and chuck 154 may be configured to secure the semiconductor wafer with a vacuum or mechanical clamping. Other implementations of system 100 may require other configurations of chuck 154. For example, when used in the life science field, chuck 154 may be shaped and configured to receive a liquid. In other examples, chuck 154 may be configured to receive a printed circuit board, substrate or packaged part, a high temperature crucible, a specimen slide, as desired.

It may be desirable to provide a stage 157 that allows chuck 154 to be adjusted in order to place DUT 103 in a selected position for analysis and examination. Such adjustments may accommodate differences in the height and/or thickness of the variety of chucks 154 discussed above. For example, stage 157 may be manipulated in a variety of directions, e.g., an x-direction, a y-direction, a z-direction, and/or a θ-direction. Like other components 106 of modular probe system 100, stage 157 is configured to be releasably secured to mounting interface 109 via connectors, e.g., quick-release connectors 133. Using these connectors, modular probe system 100 can be configured to include a stage 157 that operates manually, e.g., using a mechanical or fluid drive, semiautomatically, e.g., using a motorized device without encoder feedback or fully-automatically, e.g., one that is programmable with encoder feedback Components 106 may optionally include a DUT handler 163 (FIG. 2) that semiautomatically or automatically moves DUTs 103 onto, and removes the DUTs from, chuck 154. Of course, DUTs 103 may be manually positioned on chuck 154. Typically, but not necessarily, DUT handler 163 interacts with stage 157, probes 112 and/or vision system 151 in connection with its transport of DUT 103. Again, like other components 106 in probe system 100, DUT handler 163 may be releasably secured to mounting interface 109 using quick-release connectors, e.g., connectors 133.

Components 106 may further include a controller 166 (FIG. 1) connected to probes 112 to receive test information detected by the probes. Controller 166, like other components 106, may be releasably secured to mounting interface 109 using quick-release connectors 133. Controller 166 can be any sensing device that is able to measure an entity and returns a result that the operator can use to determine if the DUT is good, bad or marginal. Controller 166 can be used to measure, but is not limited to measuring, current, voltage, resistance, capacitance, HF/Microwave, pressure, optical, fluidic measurement systems.

Figure 4:
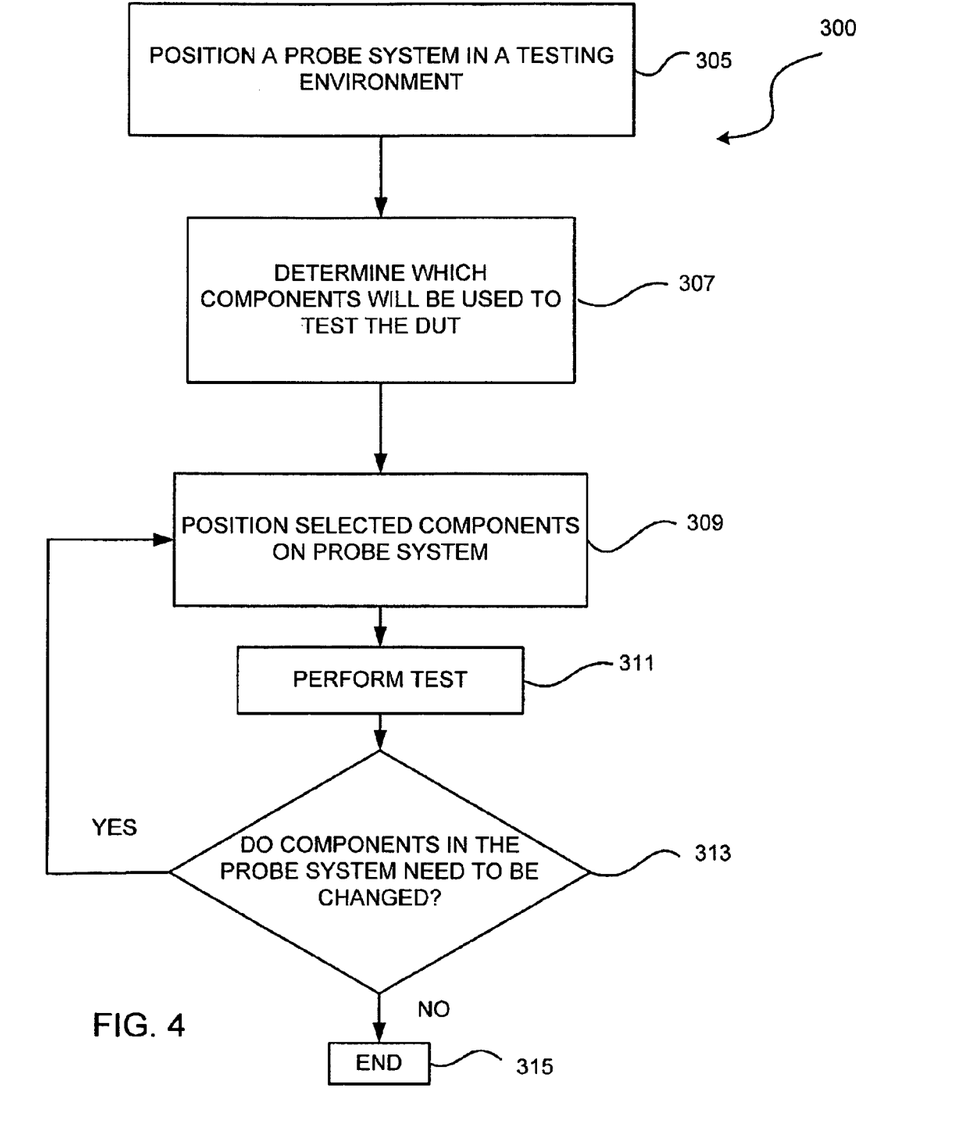
FIG. 4 is a flow diagram of an example of a method for using a modular probe system, such as the modular probe system illustrated in FIGS. 1 and 2.

FIG. 4 illustrates the steps of a method 300 for configuring a modular probe system, such as modular probe system 100 of FIG. 1. Method 300, at step 305, involves positioning a probe system in a testing environment. As discussed above, a feature of a modular probe system 100 made in accordance with concepts of the present invention is that it does not need to be moved from its testing environment for upgrades, modifications, and other changes. Rather, it requires a substantially one-time set-up. Such set-up may include placing the probe system in the test environment, leveling the platform in accordance with pre-determined standards, securing the platform to the floor or other portion of the test environment, and other steps used in setting up similar test and probe equipment.

Method 300 includes, at step 307, determining the requisite components 106, e.g., probes 112, vision systems 151, chucks 154, necessary to perform the desired test for DUT 103. As discussed above, modular probe system 100 may be configured to perform a wide variety of tests, on a wide variety of DUTs 103, in an wide array of scientific fields.

Method 300 further includes, at step 309, positioning each of the selected components 106 in probe system 100 in a manner that permits a user to test one or more properties of a DUT 103. Preferably, each device can be positioned using one or more quick-release connectors, such as quick-release connectors 133 discussed above. Typically, this will take a user no longer than 15-30 minutes with or without hand tools.

Next, method 300 includes, at step 311, performing the desired test on DUT 103.

Method 300 includes, at step 313, determining whether components 103 need to be changed to test a different property of the DUT, to test a different DUT, and/or to test a different DUT in a different scientific field. As discussed above, modular probe system 100 discussed herein is designed to provide a flexible test platform. That is, modular probe system can be set up (using requisite components, probes, and vision system) for a first test property on a first DUT in a first scientific field. It can then be reconfigured to test a second test property on a second DUT in a second scientific field in just a few minutes. For example, if the first DUT is a semiconductor wafer, then components 106 are configured in a manner that permits testing of a first electrical test property on the wafer. Then, when a second electrical test on the wafer is to be, performed, components 106 can be moved, adjusted, or otherwise reconfigured to test the second test property. Next, when a biological test is to be performed on a sample on a microscope slide, then components 106 can be removed, changed, added, or otherwise placed in a configuration suited to perform the biological test.

If it is determined at step 313 that components 106 need to be changed, then the method returns to step 309. If, on the other hand, it is determined at step 313 that no change in components 106 is needed, then the method ends at step 315.

Figure 5A:
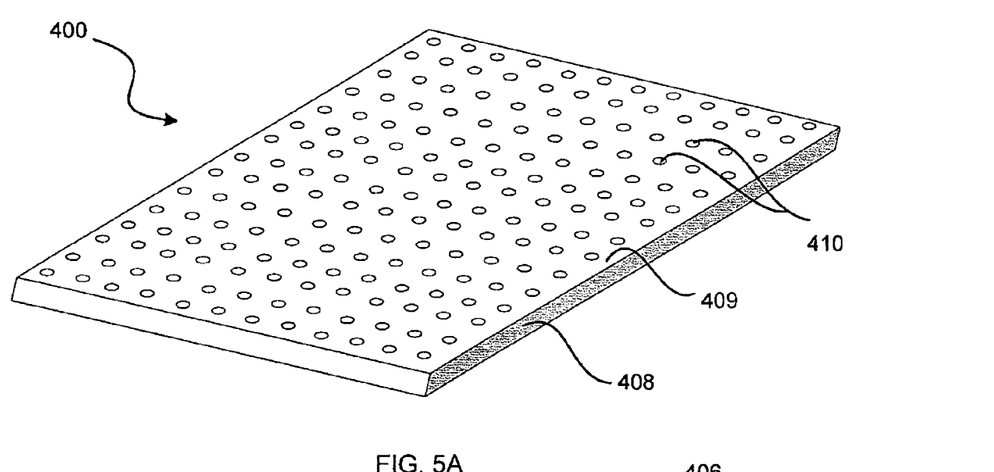
FIGS. 5A-5E are perspective views showing how various components may be added to and removed from a modular probe system.

FIGS. 5A-E illustrate examples of how a modular probe system, i.e., probe system 400, may be differently configured using a method, such as method 300 discussed above. In a first configuration, as shown in FIG. 5A, system 400 includes a base 408 having a mounting interface 409 with a plurality of apertures 410.

Figure 5B:
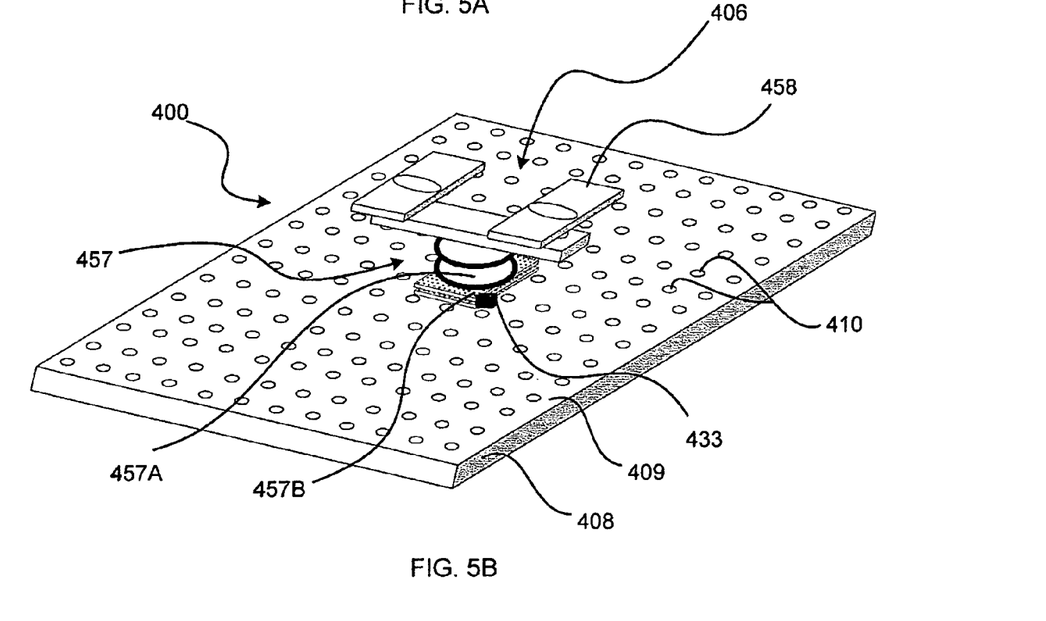

Next, as shown in FIG. 5B, components 406 are added. These components 406 include a two-part stage 457 having a Z-stage 457A and a theta stage 457B, which are releasably connected to mounting interface 409 using one or more quick-release connectors 433, only one of which is shown for convenience of illustration. In the present example, stage 457 includes two adjustable moving plates 458. Preferably, plates 458 may be configured to receive a chuck (not shown) or DUT (not shown). They often can be actuated in a manner that permits it to receive chucks and/or DUTs of various sizes, shapes, and overall configurations.

Figure 5C:
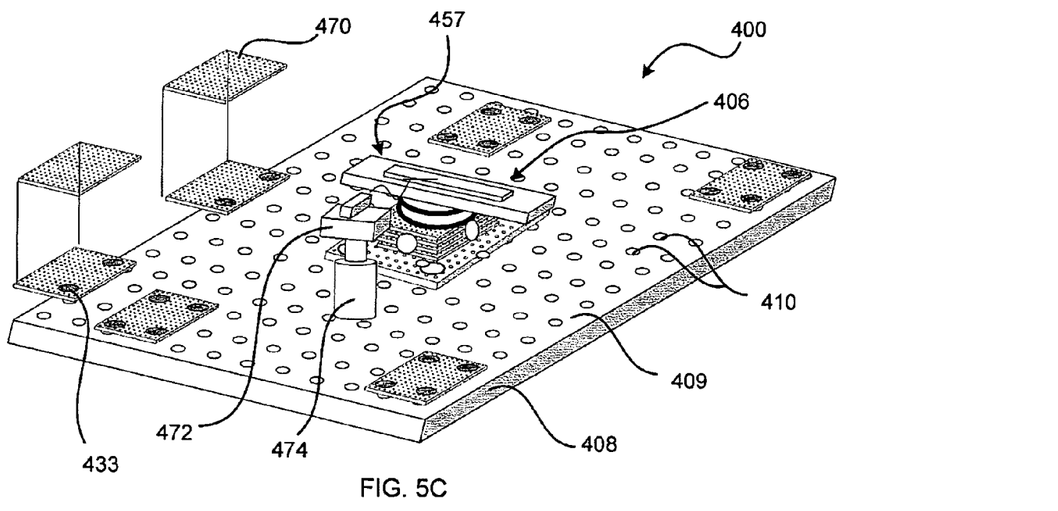

Turning next to FIG. 5C, probe system 400 is shown with a collection of components 406 that differs from the collection illustrated in FIG. 5B. This second configuration includes, for example, components 406 selected to test a different DUT 103 than the DUT being tested in the probe system 400 shown in FIG. 5B, in a different scientific field. Accordingly, stage 457, which could be used to support a semiconductor wafer, for example, is removed and is replaced with a second stage 457, which, for example, may be used to support a life science DUT 103 (not shown).

Other components 406 may also be added, such as adjustable height instrumentation and optics mounting plates 470, manipulator 472, and tool-support posts 474. Components 406 illustrated in FIG. 5C may be releasably secured to mounting interface using quick-release connectors 433. Typically, the change-over from the set-up shown in FIG. 5B to the set-up shown in FIG. 5C does not exceed about 30 minutes, and can be performed by a user without tools, or, alternatively, with hand tools. More generally, the change-over may take from about 10 minutes to about 45 minutes.

Figure 5D:
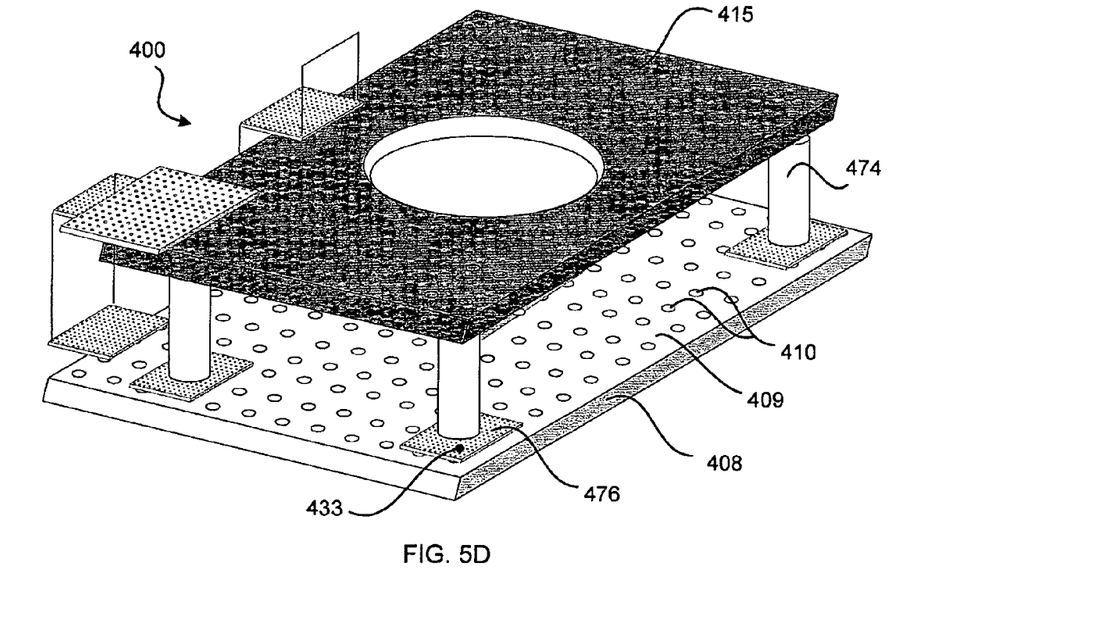

Referring to FIG. 5D, yet another configuration of probe system 400 is illustrated. Here, several tool-support posts 474 are releasably secured to mounting interface 409 via tool-less mounting plates 476. A support platen 415 is then mounted on posts 474, all by hand or with simple hand tools. A plurality of quick-release connectors 433, only one of which is shown for convenience of illustration, are used to secure the various components 406 to mounting interface 409.

Figure 5E:
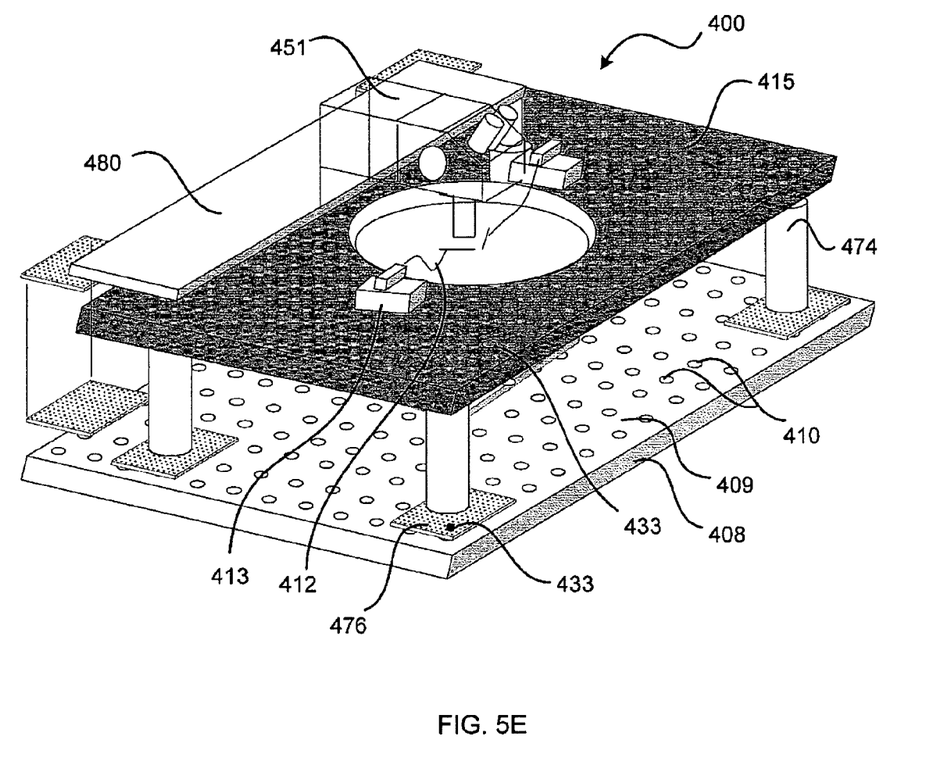

Turning next to FIG. 5E, the change in configuration of components 406 illustrated in FIG. 5D continues in FIG. 5E. Probes 412 and manipulators 413 are secured to support platen 415 using quick-release connectors 433, vision system 451 is added, and a tool-less mounting bridge 480 is provided. Typically, about 15-30 minutes is required to add the components 406 illustrated in FIG. 5E to the components 406 illustrated in FIG. 5D.

Exemplary embodiments have been disclosed above and illustrated in the accompanying drawings. It will be understood by those skilled in the art that various changes, omissions and additions may be made to that which is specifically disclosed herein without departing from the spirit and scope of the present invention.

What is claimed is:

1. A probe system for testing a device-under-test (DUT), comprising:
   a base having a mounting interface;
   a first stage releasably secured to said mounting interface so as to be replaceable with a second stage in less than 60 minutes with only hand tools or by hand;
   a first chuck releasably secured to one of said first and second stages so as to be replaceable with a second chuck in less than 60 minutes with only hand tools or by hand, wherein said first and second chucks are capable of supporting the DUT;

a first manipulator releasably secured proximate one of said first and second chucks so as to be replaceable with a second manipulator in less than 60 minutes with only hand tools or by hand; and a first probe releasably secured to one of said first and second manipulators so as to receive test information from the DUT and so as to be replaceable with a second probe in less than 60 minutes with only hand tools or by hand.

2. A probe system according to claim 1, further including a plurality of quick-release connectors for releasably securing at least one of said first and second stages to said mounting interface, at least one of said first and second chucks to one of said first and second stages, at least one of said first and second manipulators proximate one of said first and second chucks, and at least one of first and second probes to one of said first and second manipulators.

3. A probe system according to claim 1, wherein said first chuck is designed to support a first DUT used in a first technical field and said second chuck is designed to support a second DUT used in second technical field different than said first technical field.

4. A probe system according to claim 1, wherein said first and second chucks are designed to support DUTs selected from the group consisting of a fluid, a solid, a biological material, a microscope slide, a semiconductor chip, and a printed circuit board.

5. A probe system according to claim 1, wherein said first probe is designed for use in performing a first test on a DUT and said second probe is designed for use in performing a second test on a DUT that is different than said first test.

* * * * *